(12) United States Patent
Chamness

(10) Patent No.: US 8,880,484 B1
(45) Date of Patent: Nov. 4, 2014

(54) COMPRESSION FORECASTING FOR A DEDUPLICATING STORAGE SYSTEM

(71) Applicant: EMC Corporation, Hopkinton, MA (US)

(72) Inventor: Mark Chamness, Menlo Park, CA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 14/058,469

(22) Filed: Oct. 21, 2013

Related U.S. Application Data

(63) Continuation of application No. 13/174,499, filed on Jun. 30, 2011, now Pat. No. 8,595,198.

(51) Int. Cl.
*G06F 7/00* (2006.01)
*G06F 17/00* (2006.01)
*G06F 3/06* (2006.01)

(52) U.S. Cl.
CPC ............. *G06F 3/0641* (2013.01); *G06F 3/067* (2013.01); *G06F 3/0619* (2013.01)
USPC ........................... 707/693; 382/232; 382/244

(58) Field of Classification Search
USPC .................................. 707/693; 382/232, 244
See application file for complete search history.

(56) References Cited

U.S. PATENT DOCUMENTS

| | | | |
|---|---|---|---|
| 6,317,808 B1 * | 11/2001 | Berenshteyn | 711/112 |
| 6,671,774 B1 * | 12/2003 | Lam et al. | 711/112 |
| 7,783,510 B1 * | 8/2010 | Gilgur et al. | 705/7.25 |
| 2001/0024522 A1 * | 9/2001 | Nakao | 382/232 |
| 2004/0153471 A1 * | 8/2004 | Saika et al. | 707/104.1 |
| 2008/0281564 A1 * | 11/2008 | Suzuki et al. | 703/2 |
| 2010/0082287 A1 * | 4/2010 | Bonino et al. | 702/150 |
| 2010/0250748 A1 * | 9/2010 | Sivasubramanian et al. | 709/226 |
| 2011/0289290 A1 * | 11/2011 | Akirav et al. | 711/162 |

* cited by examiner

*Primary Examiner* — Hares Jami
(74) *Attorney, Agent, or Firm* — Van Pelt, Yi & James LLP

(57) ABSTRACT

A system for managing a storage system comprises a processor and a memory. The processor is configured to receive storage system information from a deduplicating storage system. The processor is further configured to determine a compression forecast based at least in part on the storage system information. The processor is further configured to provide a capacity forecast. The memory is coupled to the processor and configured to provide the processor with instructions.

18 Claims, 14 Drawing Sheets

US 8,880,484 B1

COMPRESSION FORECASTING FOR A DEDUPLICATING STORAGE SYSTEM

CROSS REFERENCE TO OTHER APPLICATIONS

This application is a continuation of co-pending U.S. patent application Ser. No. 13/174,499, entitled COMPRESSION FORECASTING FOR A DEDUPLICATING STORAGE SYSTEM filed Jun. 30, 2011 which is incorporated herein by reference for all purposes.

BACKGROUND OF THE INVENTION

Organizations are generating and accumulating increasingly large amounts of electronic data that needs to be properly retained and promptly accessible when needed. Given the large volume of data involved and the extended retention period for much of this data, it is critical that a storage system be able to store data efficiently. One way of storing data efficiently is to use an efficient storage system such as a deduplicating storage system. However, even with a deduplicating system, it is possible for storage efficiency to degrade. If storage efficiency degrades in an unplanned manner, users are not able to store any new data efficiently and the system will not be able to fulfill the user's needs.

BRIEF DESCRIPTION OF THE DRAWINGS

Various embodiments of the invention are disclosed in the following detailed description and the accompanying drawings.

DETAILED DESCRIPTION

Figure 1:
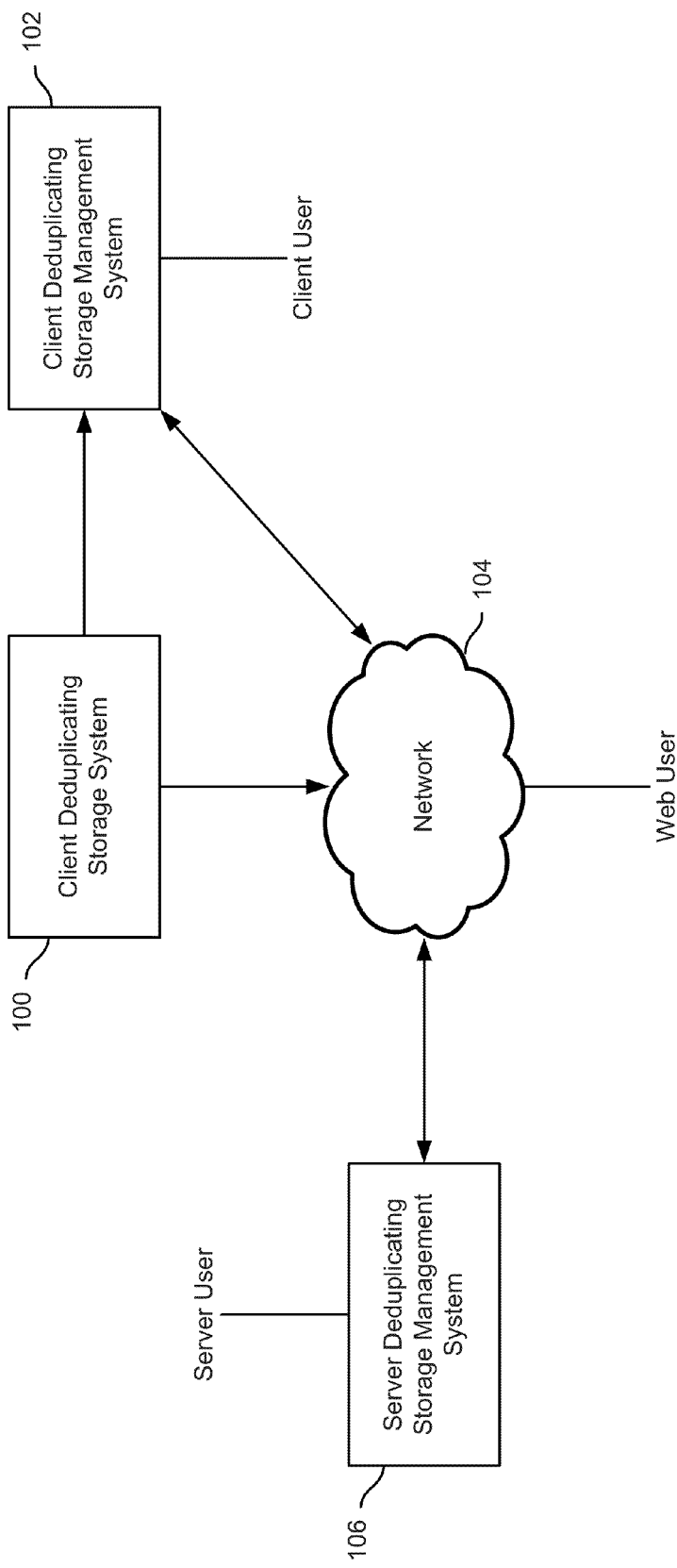
FIG. 1 is a block diagram illustrating an embodiment of a system for compression forecasting for a dedpulicating storage system.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Compression forecasting for a deduplicating storage system is disclosed. A system for managing a storage system comprises a processor and a memory. The processor is configured to receive storage system information of a deduplicating storage system, to determine a compression forecast based at least in part on the storage system information, and to provide a compression forecast. In various embodiments, the storage information comprises one or more of the following: total capacity, amount of capacity used, date information, index size, metadata size, cumulative compressed size, pre-compression size, and any other appropriate storage information or performance parameter. The memory is coupled to the processor and configured to provide the processor with instructions.

In some embodiments, a management tool is able to determine likely failure points of the system by predicting capacity or compression factors. This prediction can be used to make sure that the system will not fail because action can be taken before failure to prevent the failure. For example, more storage units can be added to the system or the existing storage units of the system can be purged of older or less desired files or files can be migrated to other tiers of a storage hierarchy (e.g., tape, off-site storage, off-line storage, etc.).

In some embodiments, a storage system is able to be cost-effectively and energy efficiently used to store files. To efficiently store the files, the file (or any input data stream) is broken into segments. For example, a hash function is used to determine a segment boundary by evaluating that hash function over a window of data in the file and looking for a location associated with a minimum or maximum value that will make a segment with a length longer than a minimum length but shorter than a maximum length. Or for another example, a fixed length is used to break up the file into segments. The files are stored as one or more segments, where the segments are deduplicated (e.g., the system targets having only one copy stored and this one copy is/can be used to reconstruct more than one file that each have the segment as part of their original content) in the storage system (e.g., deduplicated across one storage unit of the system).

In some embodiments, segments are stored in a main storage unit and periodically (e.g., every week) are transferred to a second storage unit. The transfer is based on a transfer protocol (e.g., storage unit is above a capacity limit, a number of segments every hour, when inactive, etc.), on when the storage unit is full, or on when the system meets one or more conditions (e.g., is 80% full, is less than 20% active, has had no accesses in last hour, etc.). In some embodiments, the transfer comprises copying and storing segments belonging to files identified based on a migration policy (e.g., files of a certain file type that have not been modified or accessed for a predetermined period of time are to be migrated, etc.) on a second storage unit from a primary system. As the second storage unit is filled (e.g., the segments are transferred over), metadata is transferred to the second storage unit so that the second storage unit has all the necessary information to access files based solely on information stored in the second storage unit. The metadata enables the system to reconstruct files that are stored in the system (e.g., in the whole system, in a storage unit, etc.) and/or associated files that are stored in the system with their file names. This also allows the system to power down a storage unit for energy conservation or to take a storage unit off-line to upgrade a storage unit or to enable the system to be fault tolerant in that the system can operate if any given storage unit fails. When a storage unit fills, the system transfers segments from the main storage unit to another storage unit.

In some embodiments, the system can be expanded by adding storage units incrementally. Files are accessed using the single name space providing an easy to use interface. Hardware is efficiently used as only one deduplicating engine is used for multiple storage units.

In some embodiments, the system does not have a main storage unit and stores segments in a first storage unit and then when the first storage unit is full, the system stores segments in a second storage unit.

In some embodiments, a file is identified by a name that is independent of the storage unit the file is stored in. When a file is received to be stored, a name is also received to be associated with the file. When a request to read a file is received, a name is also received. The system looks up the metadata associated with the files in the system to identify the file associated with the received name. It then looks up the metadata associated with the identified file to determine the storage unit the identified file is stored in. In various embodiments, the metadata associated with the files in the system is maintained in a main storage unit, is maintained in each storage unit where the files associated with the metadata are stored, is maintained in a distributed and/or redundant manner across many storage units (e.g., for fault tolerance), is maintained in a separated storage unit or storage unit, or any other appropriate storage location.

In some embodiments, when a next available storage unit is identified (e.g., selected) as the active storage unit, the metadata associated with the files in the system is copied to the active storage unit. This allows the metadata associated with the files in the system to be available when only the storage unit is powered up. In some embodiments, subsequent updates to the metadata associated with the files are made only to the copy of the metadata stored in the active storage unit.

In some embodiments, if the active storage unit is full, all metadata updates are flushed to the active storage unit so that each storage unit contains at least enough metadata to provide access to the files it contains. When the active storage unit fails, the system uses the metadata contained in other attached storage units (e.g., a previously active storage unit) to provide access to the files still in the system. In some embodiments, when a storage unit is unavailable (e.g. the storage unit has failed, is being upgraded, etc.), the system remains up to provide access to any file not stored in the failed storage unit.

In some embodiments, the system includes a power management unit. In the event that a storage unit is predicted to be idle for some time, the system powers down the storage unit. The system is still able to access files on any other storage unit that is not powered down. Subsequently, when the system receives a request directed at the storage unit, the system powers up the storage unit. Powering down a storage unit may include powering off some of the electronics in the disks in the storage unit, spinning down the disks, powering down the disks and/or powering down the electronics in the storage unit, or any other appropriate power saving step. The power down action may depend on how long the storage unit is predicted to be idle. In some embodiments, the length of time a storage unit is predicted to be idle is based on how long the storage unit has been idle. For example, if a storage unit has not received any request for a predetermined period of time, the disks in the storage unit are spun down. In the event that the storage unit has not received any request for a further predetermined period of time, the disks in the storage unit are powered off. In some embodiments, the system tracks the number of times a disk has been power cycled and uses the power cycling information to determine the appropriate power down action. For example, when the number of power cycles exceeds a predetermined threshold, the system may decide not to power down the disk any more.

In some embodiments, in the event that a file is deleted, the metadata associated with the files in the system is updated to reflect that the file is deleted. Subsequently, a space reclamation process is performed to compact the remaining files to fill up entire storage units by transferring files that have not been deleted from a storage unit (e.g., a container, drive, array of drives, etc.) to a new storage unit and deduplicating segments stored in the new storage unit. Once files have been transferred from the old storage unit, the storage unit can be made available to store new files.

In some embodiments, the system comprises a backup storage system. In some embodiments, the system is a deduplicating storage system (e.g., a storage system such as the Data Domain product of EMC Corporation, of Hopkinton, Mass.). Each storage unit is a deduplication domain, meaning that duplicate chunks of data (e.g., segments) are identified only within each storage unit and not across different storage units. Each storage unit contains a segment index that can be used to determine whether a segment already exists in the storage unit. In some embodiments, the segment index uses fingerprints to index segments.

In some embodiments, the system described is used as a tier of storage in a storage hierarchy that comprises other tiers of storage. One or more tiers of storage in this hierarchy may utilize different kinds of storage devices and/or may be optimized for different characteristics such as random update performance. Files are periodically moved among the tiers based on data management policies to achieve a cost-effective match to the current storage requirements of the files. For example, a file may initially be stored in a tier of storage that offers high performance for reads and writes. As the file ages, it may be moved into a tier of storage according to this invention. In various embodiments, tiers comprise different storage technologies (e.g., tape, hard drives, semiconductor-based memories, optical drives, etc.), different locations (e.g., local computer storage, local network storage, remote network storage, distributed storage, cloud storage, archive storage, vault storage, etc.), or any other appropriate storage for a tiered data storage system.

In some embodiments, the storage system follows a retention policy where files of different ages are retained or not retained (e.g., files older than 7 years are removed). In some embodiments, the retention policy is dependent on type of file (e.g., financial information is retained indefinitely, email is retained for 1 year, tax information is retained 7 years, etc.).

FIG. 1 is a block diagram illustrating an embodiment of a system for compression forecasting for a deduplicating storage system. In the example shown, client deduplicating storage system 100 is managed by client deduplicating storage management system 102. For example, client deduplicating storage management system 102 provides a manager tools to monitor a storage system (e.g., performance metrics), to control the storage system (e.g., to adjust garbage collection frequency when no longer used segments are deleted), to adjust parameters for the storage system, to analyze the storage system (e.g., determine statistics based on metrics, model performance, predicted performance), to provide notifications or reports about the storage system, etc. Client deduplicating storage system 100 is further managed by server deduplicating storage management system 106 via network 104. In various embodiments, network 104 comprises one or more of a wired network, a wireless network, a local area network, a wide area network, the Internet, or any other appropriate network. In some embodiments, a client user manages a plurality of deduplicating storage management systems associated with the client user using client deduplicating storage management system 102. In some embodiments, a server user manages a plurality of deduplicating storage management systems associated with a plurality of client users using server deduplicating storage management system 106. In some embodiments, a user comprises a sales representative, a technical consultant, or any other appropriate user.

Figure 2A:
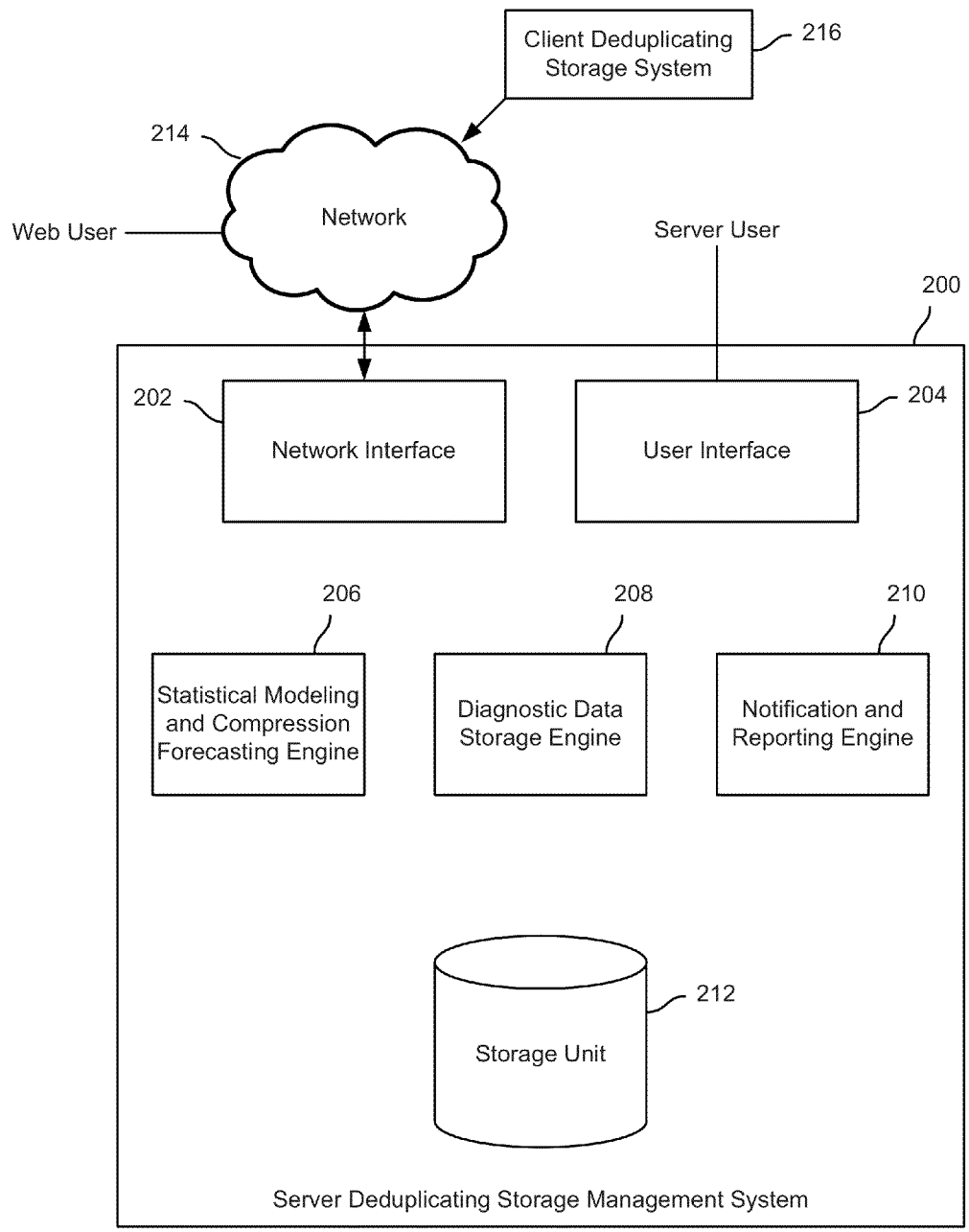
FIG. 2A is a block diagram illustrating an embodiment of a server deduplicating storage management system.

FIG. 2A is a block diagram illustrating an embodiment of a server deduplicating storage management system. In some embodiments, the system of FIG. 2A is used to implement server deduplicating storage management system 106 of FIG. 1. In the example shown, server deduplicating storage management system 200 comprises network interface 202, user interface 204, statistical modeling and compression forecasting engine 206, diagnostic data storage engine 208, notification and reporting engine 210, and storage unit 212. In some embodiments, network interface 202 communicates with network 214. In some embodiments, user interface 204 communicates with a server user. In some embodiments, statistical modeling and compression forecasting engine 206 determines statistical modeling and compression forecasting associated with a deduplicating storage system. In some embodiments, diagnostic data storage engine 208 stores diagnostic data associated with a deduplicating storage system to storage unit 212. In some embodiments, notification and reporting engine 210 provides notification and reporting to a server user and/or a web user. In some embodiments, server deduplicating storage management system 106 receives storage information associated with a number of different client systems and is able to provide aggregated statistics or predictions based on data across clients and individual storage system installations as well as just a single installation or a single system. In some embodiments, reports or prediction results or notifications are sent to client interface representatives to provide service/sales support for systems with an existing or predicted failure to address the existing or predicted failure(s).

Figure 2B:
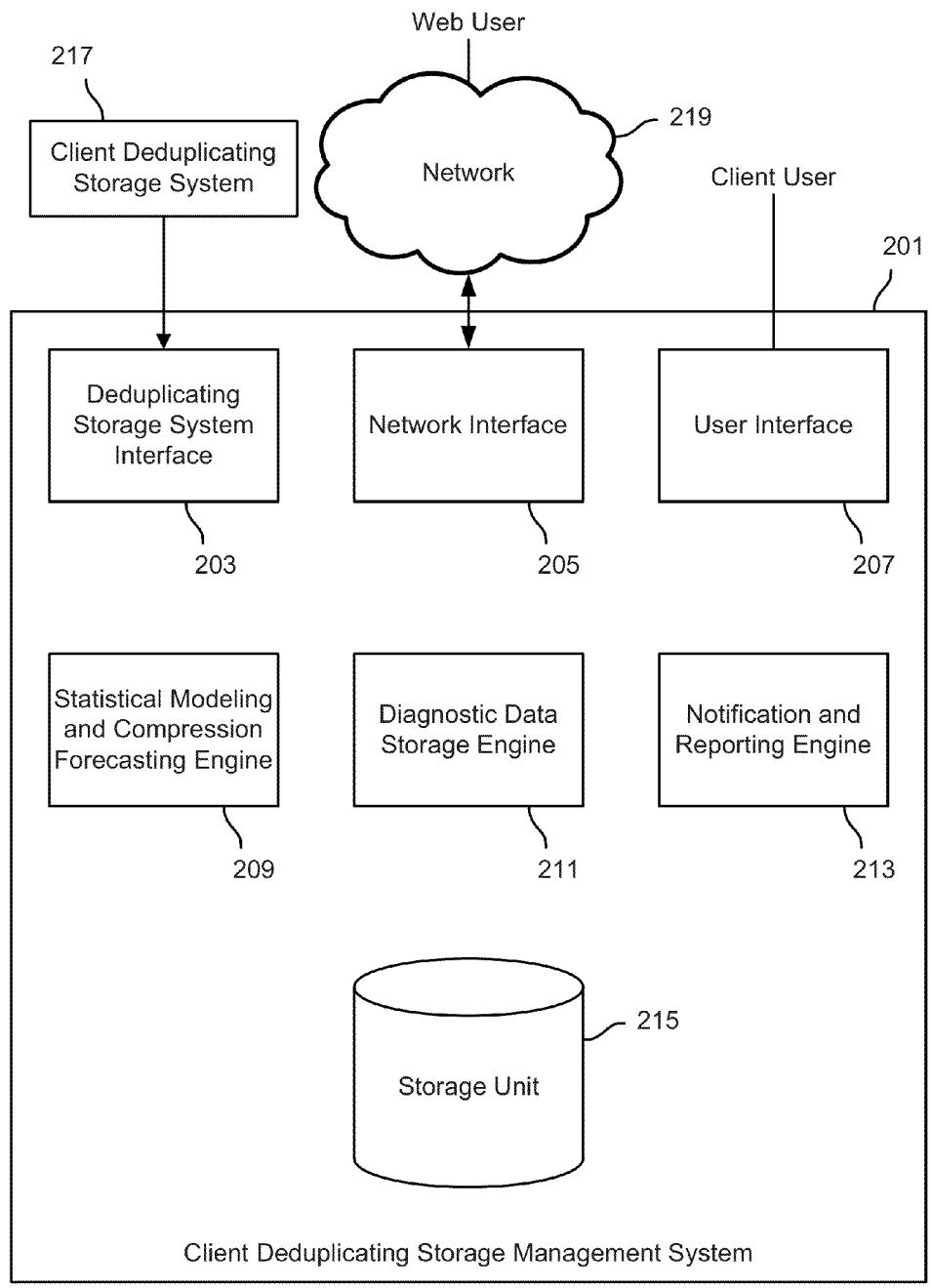
FIG. 2B is a block diagram illustrating an embodiment of a client deduplicating storage management system.

FIG. 2B is a block diagram illustrating an embodiment of a client deduplicating storage management system. In some embodiments, the system of FIG. 2B is used to implement client deduplicating storage management system 102 of FIG. 1. In the example shown, client deduplicating storage management system 201 comprises deduplicating storage system interface 203, network interface 205, user interface 207, statistical modeling and compression forecasting engine 209, diagnositic data storage engine 211, notification and reporting engine 213, and storage unit 215. In some embodiments, deduplicating storage system interface 203 communicates with a deduplicating storage system. In some embodiments, network interface 205 communicates with network 219. In some embodiments, user interface 207 communicates with a client user. In various embodiments, statistical modeling and compression forecasting engine 209 determines statistical modeling and compression forecasting associated with a deduplicating storage system. In some embodiments, diagnostic data storage engine 211 stores diagnostic data associated with a deduplicating storage system to storage unit 215. In various embodiments, notification and reporting engine 213 provides notification and reporting to a client user, a web user, or any other appropriate user.

In some embodiments, diagnostic data comprises total storage capacity, total storage capacity used, precompression size, cumulative compressed size, metadata size, index size, associated date and/or time-stamp of the diagnostic data, or any other appropriate diagnostic data. In some embodiments, precompression size comprises a size of storage capacity of a deduplicating storage system prior to compression performed by the deduplicating storage system. In some embodiments, cumulative compressed size comprises physical used space of a deduplicating storage system. In some embodiments, metadata size comprises total size of metadata stored in a deduplicating storage system. In some embodiments, index size comprises total size of indices stored in a deduplicating storage system. In some embodiments, total storage capacity, total storage capacity used, precompression size, cumulative compressed size, metadata size, and/or index size are measured in gigabytes or any other appropriate unit. In various embodiments, compression factor is calculated or compression factor is received precalculated, or any other appropriate manner of obtaining compression statistics. In some embodiments, a compression factor is a measure of storage compression and storage efficiency.

In some embodiments, a storage unit stores performance data associated with a deduplicating storage system. In various embodiments, performance data comprises diagnostic data associated with a deduplicating storage system, statistical measures, compression forecasting data, or any other appropriate performance data. In various embodiments, performance data comprises a compression threshold date, total storage capacity, total storage capacity used, percentage of total capacity used, space usage rate per day, a date a most recent diagnostic data summary was received, a date a most recent Autosupport was received, a hostname associated with a deduplicating storage system, compression factor, a version of operating system software operating on a deduplicating storage system, or any other appropriate performance data. In some embodiments, an Autosupport comprises a summary of diagnostic data associated with a deduplicating storage system. In various embodiments, a summary of diagnostic data associated with a deduplicating storage system is received by a local client deduplicating storage management system, remote server deduplicating storage management system, or any appropriate deduplicating storage management system. In various embodiments, a storage unit comprises a storage device, multiple storage devices, a portion of a storage device, a hard drive, an array of drives, a semiconductor memory, or any other appropriate storage unit.

Figure 3:
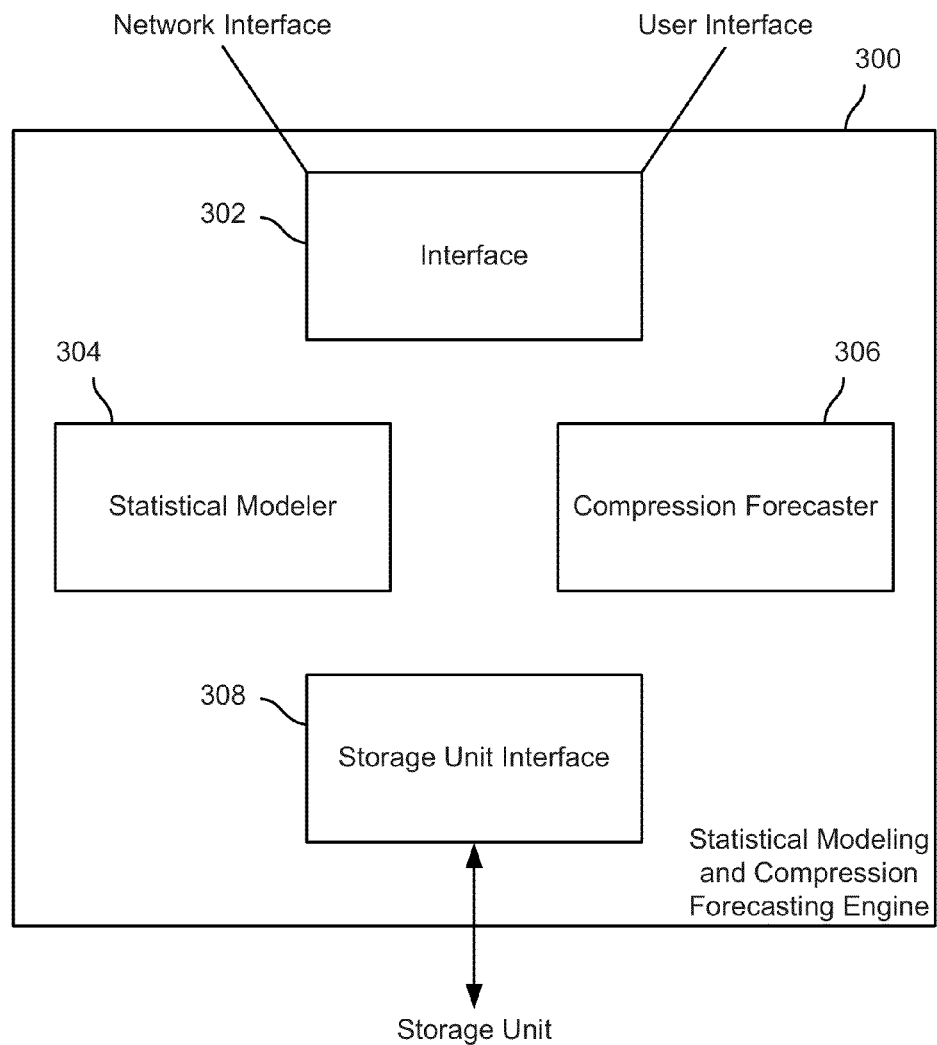
FIG. 3 is a block diagram illustrating an embodiment of a statistical modeling and compression forecasting engine.

FIG. 3 is a block diagram illustrating an embodiment of a statistical modeling and compression forecasting engine. In some embodiments, the system of FIG. 3 is used to implement statistical modeling and compression forecasting engine 206 of FIG. 2A and/or statistical modeling and compression forecasting engine 209 of FIG. 2B. In the example shown, statistical modeling and compression forecasting engine 300 of FIG. 3 comprises interface 302, statistical modeler 304, compression forecaster 306, and storage unit interface 308. In various embodiments, interface 302 communicates with a network interface and/or a user interface. In various embodiments, data determined by statistical modeler 304 and/or compression forecaster 306 are/is stored to a storage unit using storage unit interface 308.

In some embodiments, a statistical modeler determines statistical modeling. In some embodiments, statistical modeling comprises determining statistical measures of a set of data associated with a deduplicating storage system. In some embodiments, a set of data associated with a deduplicating storage system is received from a storage unit. In some embodiments, the set of data is historical data associated with the deduplicating storage system. In some embodiments, the set of data is observed data associated with the deduplicating storage system. In various embodiments, statistical measures comprise a standard deviation, an average, or any other appropriate statistical measures. For example, determining a 14 day average of compression factors comprises selecting a set of 14 dates. 14 compression data points are selected from a storage unit, where each of the compression factor data points corresponds to the compression factor on one of the selected 14 dates. The 14 data points are averaged to determine a 14 day average of compression factors. In some embodiments, determined statistical measures are stored to a storage unit. For example, the standard deviation of a compression factor data point with respect to a determined mean and/or estimate of compression factors is stored to a storage unit. In another example, the number of standard deviations an n-day average of compression factors is away from a m-day average of compression factors, where n and m are different numbers, is determined. The number of standard deviations indicates a divergence of recent behavior from historical behavior.

In some embodiments, a compression forecaster determines compression forecasting. In some embodiments, compression forecasting comprises predicting a compression factor of a deduplicating storage system at a specified date and/or time. In some embodiments, compression forecasting comprises determining a forecasted compression factor threshold date. For example, a forecasted compression factor threshold date comprises a forecasted date on which the compression factor of a deduplicating storage system reaches a compression factor threshold. In some embodiments, the compression factor threshold is unity. In some embodiments, compression forecasting comprises regression analysis. In various embodiments, regression analysis comprises linear regression analysis, logistic regression analysis, ensemble regression analysis, or any other appropriate form and/or type of analysis. In some embodiments, regression analysis comprises fitting a predictive model to an observed data set of input and output values. In some embodiments, an observed data set of values is received from a storage unit. In some embodiments, an observed data set comprises data based at least in part on data received from a deduplicating storage system. In some embodiments, an observed data set comprises a subset of all observed historical data stored in a storage unit. In various embodiments, compression factor is calculated based at least in part on received information or compression factor is received already calculated. In some embodiments, fitting a predictive model to an observed data set of input and output values comprises determining a function relating a set of input variables and an output variable associated with the observed input and output values. In some embodiments, determining a function comprises determining parameters associated with the function. In various embodiments, an input variable comprises a date and an output variable comprises a compression factor. In some embodiments, a date comprises a number of time steps away from a first date. For example, a date is represented by a number of days, a number of months, a number of years, or any other appropriate number of time steps away from a first date. In various embodiments, an observed data set of input values comprises a data set of observed dates and an observed data set of output values comprises a data set of observed compression factors on each of the observed dates. In some embodiments, a data set of observed compression factors is determined based at least in part on diagnostic data stored on a storage unit. For example, an observed compression factor is based at least in part on observed precompression size, cumulative compressed size, metadata size, and index size. For example, an observed compression factor is determined based at least in part on equation (1).

$$\text{compression factor} = \frac{\text{precompression size}}{\text{cumulative compressed size} + \text{metadata size} + \text{index size}} \quad (1)$$

In some embodiments, a fitted predictive model is used to predict and/or estimate a compression factor on a specified date, where the specified date is an input to the fitted predictive model and a predicted and/or estimated compression factor is an output of the fitted predictive model. In some embodiments, an inverse of the fitted predictive model is used to determine a date on which an inputted compression factor will be reached.

In some embodiments, linear regression analysis comprises fitting a linear predictive model to an observed data set of input and output values. For example, a linear predictive model is fitted to an observed data set of selected dates and compression factor on each of the selected dates. The dates and compression factors on each of the selected dates comprise data selected from a storage unit. Observed input values comprise the selected dates. Observed output values comprise the compression factors on each of the selected dates. In some embodiments, a linear function relating dates and compression factors is determined based at least in part on the observed data set of selected dates and compression factors on each of the selected dates. For example, piece-wise linear regression is determined for a set of recent data. In some embodiments, a plurality of linear regressions are fitted to a set of data. The linear regression with the best fit (e.g., having the greatest R squared value) is chosen for forecasting. For example, a linear function such as that shown in equation (2) is determined. In some embodiments, parameters associated with the linear function are determined. In some embodiments, a parameter associated with the linear function comprises a slope of the linear function, an intercept point, an error term, or any other appropriate parameter.

$$\text{compression factor} = \alpha + \beta*\text{date} + \epsilon \qquad (2)$$

For example, in equation (2), parameter $\alpha$ corresponds to an intercept point, $\beta$ corresponds to a slope, and $\epsilon$ corresponds to an error term.

A forecasted compression factor on a selected input date is predicted based at least in part on the determined linear function (or, for example, a fitted predictive model). In some embodiments, a forecasted compression factor threshold date is predicted based at least in part on a linear function, where the linear function determines an output compression factor based at least in part on an input date. In some embodiments, an inverse function of the linear function is used to determine the forecasted compression factor threshold date. For example, a threshold compression factor is inputted to the inverse linear function, and a compression factor threshold date is outputted. For example, equation (3) is an inverse function of linear function equation (2).

$$\text{date} = \frac{\text{compression factor} - \alpha - \varepsilon}{\beta} \qquad (3)$$

In some embodiments, logistic regression analysis comprises fitting a logistic predictive model to a set of data. In some embodiments, ensemble regression analysis comprises fitting a plurality of predictive models to a plurality of subsets of a set of data. For example, a set of data comprising compression factors on a plurality of days is grouped by day of the week. For example a subset of data corresponding to compression factors on Mondays is determined. A subset of data corresponding to compression factors on Tuesdays is further determined. A first predictive model is fitted to the subset of data corresponding to Mondays. A second predictive model is fitted to the subset of data corresponding to Tuesdays. In some embodiments, data determined using compression forecasting is stored to a storage unit. In various embodiments, data determined using compression forecasting comprise a compression factor threshold date, a plurality of observed compression factors corresponding to a plurality of dates, a plurality of projected compression factors corresponding to a plurality of dates, or any other appropriate data determined using compression forecasting. In some embodiments, a fitted predictive model is stored to a storage unit In some embodiments, an interface receives compression forecast generation criteria. In some embodiments, a compression forecaster includes default compression forecast generation criteria. In various embodiments, generation criteria comprise a plurality of threshold values. For example, compression forecasting is not determined in the event that insufficient historical and/or observed data is available. For example, if less than 10 data points are available, compression forecasting is not determined.

In some embodiments, an interface receives compression forecast model validation criteria from a user. In some embodiments, a compression forecaster comprises default compression forecast model validation criteria. In some embodiments, compression forecast model validation criteria comprise criteria for validating a compression forecast model. In some embodiments, a compression forecast model comprises a determined fitted predictive model for regression analysis for compression forecasting. In various embodiments, validation criteria comprise a plurality of threshold values. In some embodiments, validity of the fitted predictive model is determined based at least in part on whether values associated with the fitted predictive model exceed or do not exceed the plurality of threshold values. In various embodiments, compression forecast model validation criteria comprise a threshold R squared value, a threshold number of data points in a set of data, a threshold number of standard deviations of data points from a mean and/or expected value of a set of data points, or any other appropriate compression forecast model validation criteria. For example, in the event that linear regression analysis is determined, compression forecast model validation criteria comprise criteria determining whether the fitted linear predictive model comprises a negative slope. In some embodiments, an R squared value comprises a measure of goodness of fit of a predictive model to a set of observed data.

In some embodiments, statistical modeling and/or compression forecasting are determined on a scheduled basis (e.g., daily, weekly, monthly, etc.).

Figure 4:
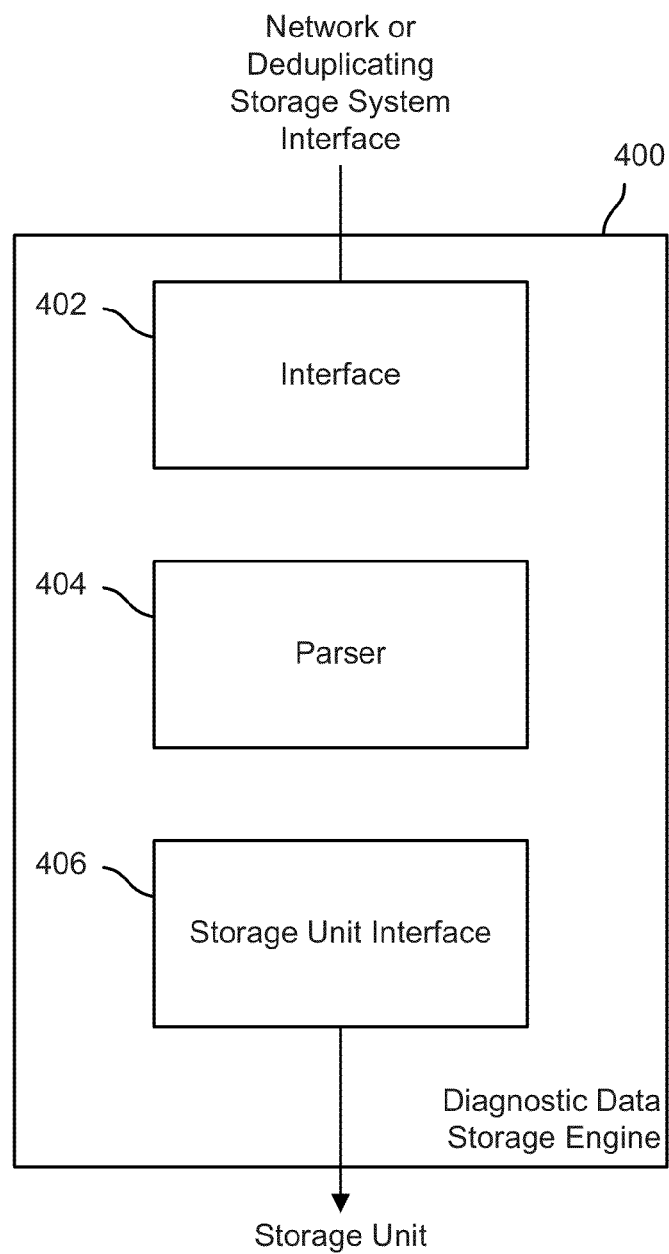
FIG. 4 is a block diagram illustrating an embodiment of a diagnostic data storage engine.

FIG. 4 is a block diagram illustrating an embodiment of a diagnostic data storage engine. In some embodiments, the system of FIG. 4 is used to implement diagnostic data storage engine 208 of FIG. 2A and/or diagnostic data storage engine 211 of FIG. 2B. In the example shown, server diagnostic data storage engine 400 of FIG. 4 comprises interface 402, parser 404, and storage unit interface 406. In some embodiments, interface 402 communicates with a network interface. In some embodiments, interface 402 communicates with a deduplicating storage system interface. In some embodiments, parser 404 parses received diagnostic data information. For example, the parser extracts important/desired data associated with a deduplicating storage system. In some embodiments, diagnostic data is stored to a storage unit using storage system interface 406.

In some embodiments, a diagnostic data storage engine receives a summary of diagnostic data associated with a deduplicating storage system. In some embodiments, the summary is provided by a deduplicating storage system via a phone-home system. In some embodiments, the phone-home system comprises a system for transmitting a summary of diagnostic data from a deduplicating storage system to a deduplicating storage management system. In some embodiments, a diagnostic data storage engine receives an Autosupport. In some embodiments, a summary of diagnostic data associated with a deduplicating storage system comprises a summary based at least in part on a simple network management protocol (SNMP). In some embodiments, a summary based at least in part on SNMP is configured to provide data associated with a deduplicating storage system using a custom application programming interface (API). In some embodiments, a summary of diagnostic data for a deduplicating storage system based at least in part on SNMP comprises CPU information, system load, network bandwidth, or any other appropriate diagnostic data. In some embodiments, the summary comprises an Autosupport. In some embodiments, a parser parses a summary diagnostic data. In some embodiments, parsing a summary of diagnostic data comprises extracting diagnostic data from the summary of diagnostic data.

Figure 5:
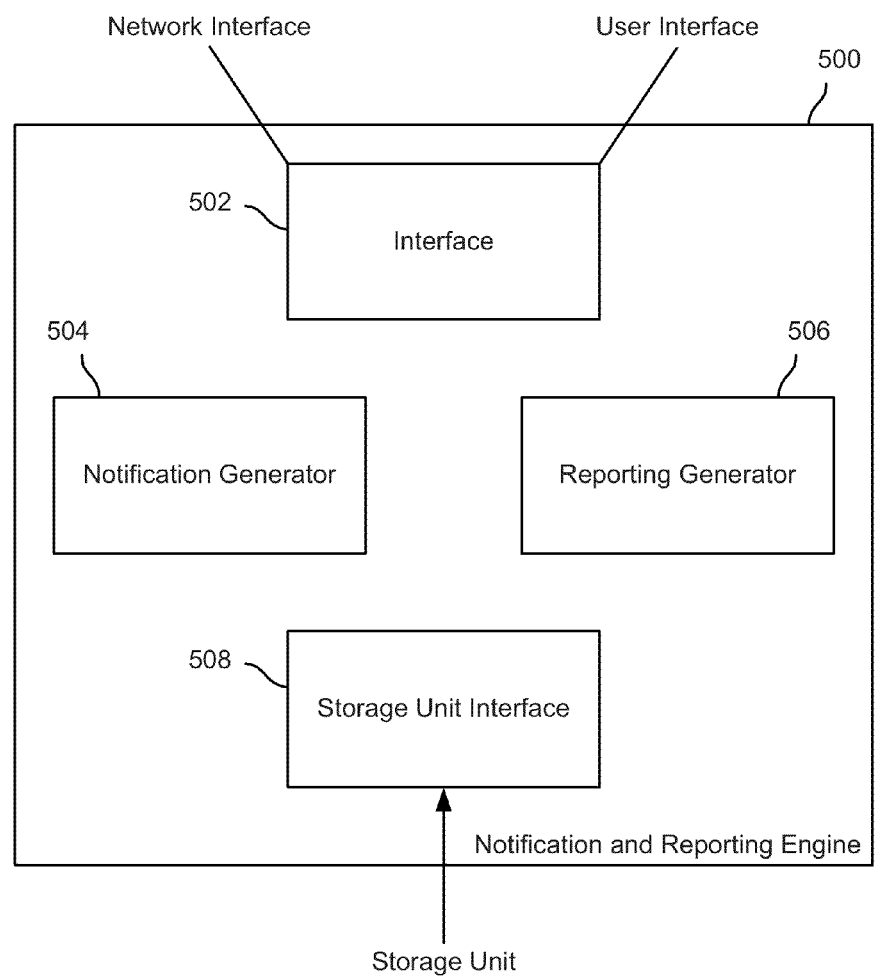
FIG. 5 is a block diagram illustrating an embodiment of a notification and reporting engine.

FIG. 5 is a block diagram illustrating an embodiment of a notification and reporting engine. In some embodiments, the system of FIG. 5 is used to implement notification and reporting engine 210 of FIG. 2A and/or notification and reporting engine 213 of FIG. 2B. In the example shown, notification and reporting engine 500 comprises interface 502, notification generator 504, reporting generator 506, and storage unit interface 508. In some embodiments, interface 502 communicates with a network interface and/or a user interface.

In some embodiments, a notification is generated using a notification generator. In some embodiments, a notification is provided to a client user, server user, web user, or any other user associated with a deduplicating storage system.

In some embodiments, an interface receives notification inclusion/exclusion critera. In some embodiments, a notification generator comprises default notification inclusion/exclusion criteria. In some embodiments, notification inclusion/exclusion criteria comprise criteria for including/excluding a deduplicating storage system from a notification. In various embodiments, inclusion criteria comprise a plurality of threshold values. In various embodiments, inclusion criteria are based at least in part on diagnostic data, statistical data, performance data, or any other appropriate data. In some embodiments, inclusion criteria comprise a request for inclusion of a deduplicating system by a client user, server user, web user, or any other appropriate user. For example, a user may want to be notified of an existing state or predicted threshold date regardless of whether a threshold is reached within a short time. In some embodiments, inclusion is determined based at least in part on whether values associated with a deduplicating storage system exceed or do not exceed the plurality of threshold values. In some embodiments, inclusion criteria comprise a number of days determined as the number of days between a current date and a forecasted compression factor threshold date. For example, if a deduplicating storage system is forecasted to reach a compression factor threshold within 60 days of the current date, an inclusion criteria has been met. In some embodiments, inclusion criteria comprise a threshold number of standard deviations. In some embodiments, in the event that an observed compression forecast data point is greater than an average and/or estimated compression factor by the threshold number of standard deviations, an inclusion criteria has been met.

In various embodiments, exclusion criteria comprise a plurality of threshold values. In some embodiments, exclusion criteria comprise a request for exclusion of a deduplicating system by a client user, server user, web user, or any other appropriate user. In some embodiments, exclusion of a deduplicating storage system from a notification is determined based at least in part on whether values associated with a deduplicating storage system exceed or do not exceed the plurality of threshold values. In some embodiments, inclusion criteria are based at least in part on diagnostic data, statistical data, performance data, or any other appropriate data. In various embodiments, exclusion criteria comprise a number of days in which compression factor has not changed, a number of days in which an autosupport has not been received, a percentage decrease in the percentage of total storage capacity used, a number of standard deviations of a compression factor data point away from a determined compression factor average across a specified number of days.

In some embodiments, a deduplicating storage system is included in a notification in the event that at least one inclusion criteria are met and not one of the exclusion criteria is met. In some embodiments, a deduplicating storage system is excluded from a notification in the event that at least one exclusion criteria is met. In some embodiments, a notification comprises a list of one, more than one, or zero deduplicating storage systems. In some embodiments, a notification comprises a list of a plurality of deduplicating storage systems associated with a client user, server user, and/or web user. In some embodiments the list of deduplicating storage systems comprises a ranked list. For example, a list of deduplicating storage systems is ranked by earliest forecasted compression factor threshold date.

In some embodiments, notification is provided based at least in part on data stored in a storage unit. In some embodiments, a notification engine provides notification based at least in part on notification inclusion/exclusion criteria. In some embodiments, notification is provided to a client user, server user, web user, or any other appropriate user.

In some embodiments, reporting is generated using a reporting generator. In some embodiments, reporting is provided based at least in part on a request from a client user, server user, and/or web user associated with a deduplicating storage system. In various embodiments, reporting comprises a graph, a report, or any appropriate reporting. In some embodiments, reporting comprises data associated with one or more deduplicating storage systems. In some embodiments, data for reporting is received from a deduplicating storage system, a storage unit of a client deduplicating storage management system, and/or a storage unit of a server deduplicating storage management. In some embodiments, a report comprises a summary of performance metrics.

In some embodiments, an interface receives an indication to provide reporting. In the event that an indication to provide reporting is received, reporting is generated and provided. In some embodiments, a reporting generator provides reporting automatically (e.g., daily, weekly, monthly, etc.). In some embodiments, an interface receives reporting preferences. In some embodiments, reporting preferences are provided by a client user, server user, web user, or any other appropriate user, or a client system, a server system, a web system, or any other appropriate system (e.g., an automated providing of a preference or a providing of a default preference or a providing of a preference generated by a system using an automated engine). In some embodiments, a reporting generator comprises default reporting preferences. In some embodiments, report preferences comprise preferences for generating reporting. In some embodiments, reporting preferences comprise a set of deduplicating storage systems to be included in reporting. In some embodiments, reporting comprises reporting information associated with a set of deduplicating storage systems specified in reporting preferences. In some embodiments, reporting comprises reporting aggregate information. In some embodiments, information is aggregated across a set of storage systems specified by reporting preferences. In various embodiments, aggregate information comprises information aggregrated across a set of deduplicating storage systems associated with an industry. In some embodiments, information for reporting comprises aggregate information across a specified subset of client deduplicating storage systems, where the specified subset of client deduplicating storage system comprises a site, or any other appropriate subset of deduplicating storage systems. In some embodiments, information for report is aggregated across deduplicating storage systems associated with a server and/or client deduplicating storage management system.

In some embodiments, reporting is provided based at least in part on data stored in a storage unit. In some embodiments, reporting is provided based at least in part on reporting preferences. In some embodiments, reporting is provided to a client user, server user, web user, or any other appropriate user.

Figure 6:
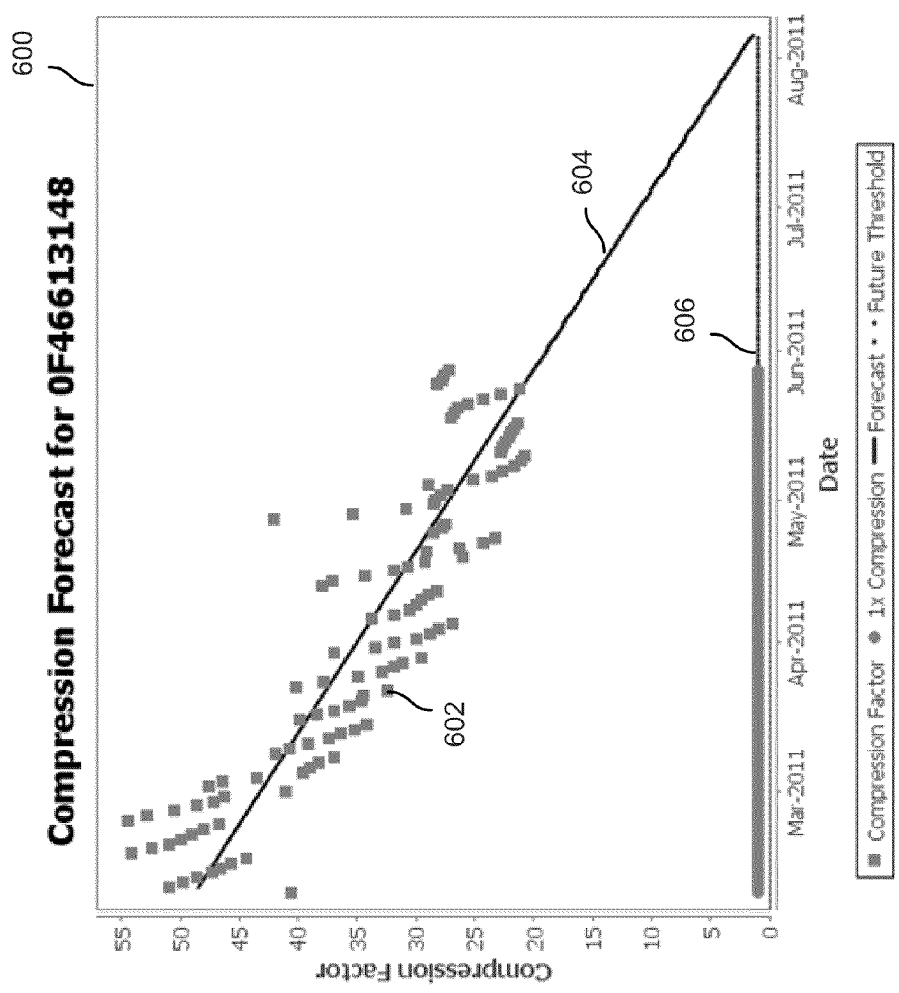
FIG. 6 is a diagram illustrating an embodiment of a reporting graph for displaying a compression forecast.

FIG. 6 is a diagram illustrating an embodiment of a reporting graph for displaying a compression forecast. In some embodiments, the graph of FIG. 6 is generated using reporting generator 506 of FIG. 5. In the example shown, graph 600 comprises observed compression factors 602, compression forecast 604, and compression factor threshold 606. In the example shown, graph 600 displays compression factor with respect to date. In various embodiments, displayed observed compression factors 602 and/or compression forecast 604 are selected from a storage unit. In the example shown, compression factor threshold 606 comprises a threshold of unity. In various embodiments, a graph comprises a histogram, bar graph, pie graph, line graph, or any other appropriate graph.

Figure 7:
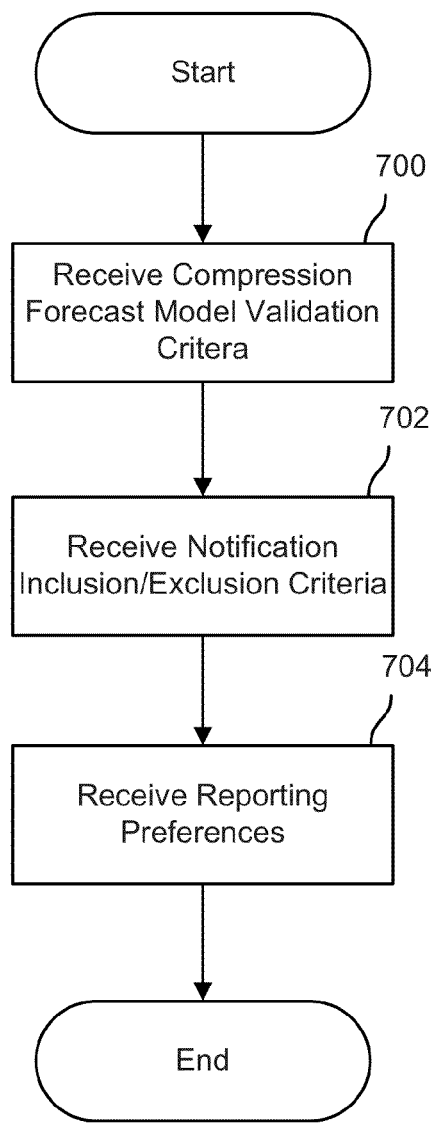
FIG. 7 is a flow diagram illustrating an embodiment of a process for initializing a system for compression forecasting for a deduplicating storage system.

FIG. 7 is a flow diagram illustrating an embodiment of a process for initializing a system for compression forecasting for a deduplicating storage system. In some embodiments, the process of FIG. 7 is executed by 200 of FIG. 2A and/or 201 of FIG. 2B. In the example shown, in 700, compression forecast model validation criteria are received. In 702, notification inclusion/exclusion criteria are received. In 704, reporting preferences are received.

Figure 8:
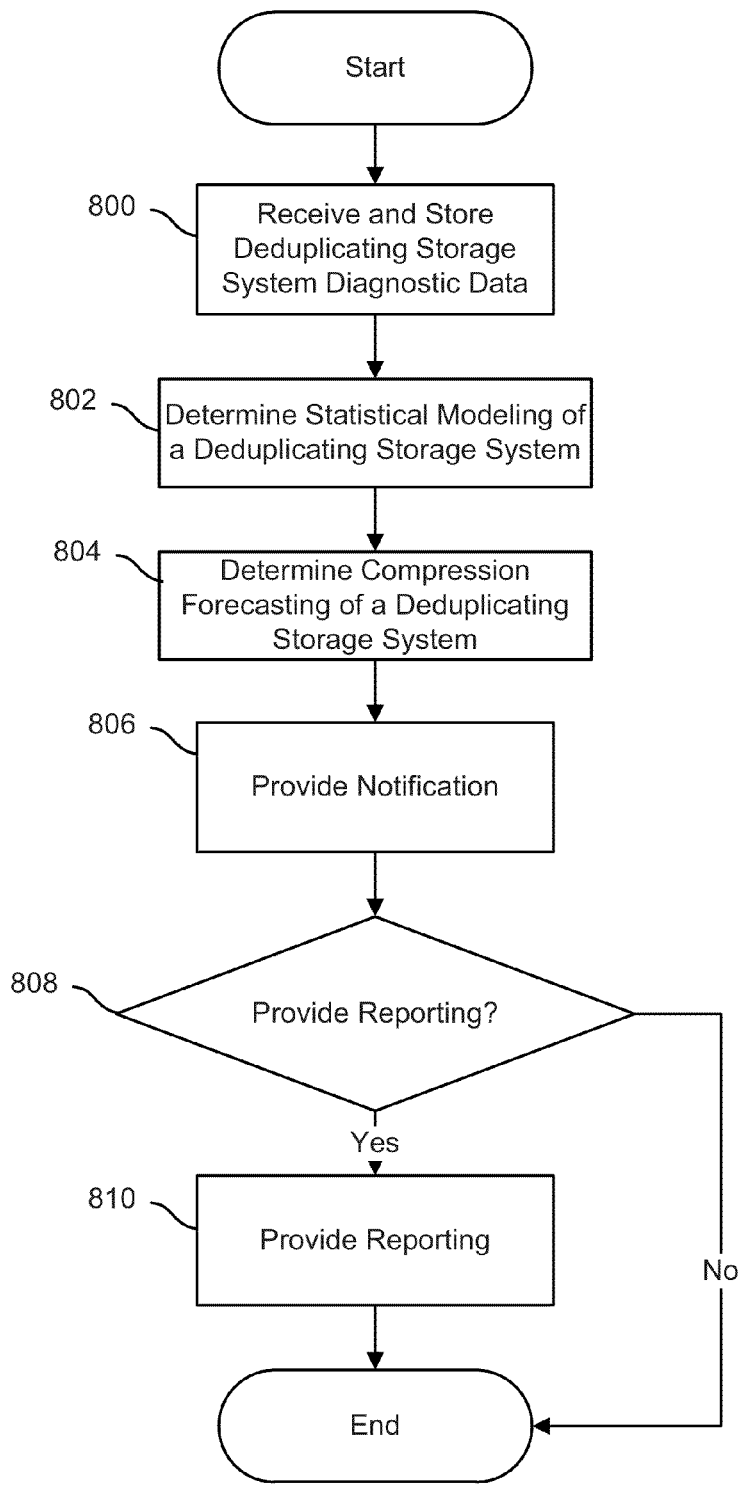
FIG. 8 is a flow diagram illustrating an embodiment of a process for managing a deduplicating storage system.

FIG. 8 is a flow diagram illustrating an embodiment of a process for managing a deduplicating storage system. In some embodiments, the process of FIG. 8 is executed by 200 of FIG. 2A and/or 201 of FIG. 2B. In the example shown, in 800, deduplicating storage system diagnostic data is received and stored. In 802, statistical modeling of a deduplicating storage system is determined. In 804, compression forecasting of a deduplicating storage system is determined. In 806, notification is provided. In 808, it is determined whether reporting should be provided. In the event that reporting should be provided, in 810, reporting is provided. In the event that reporting should not be provided, the process ends. In various embodiments, providing reporting is based at least in part on a request for reporting from a client user, server user, web user, or any other appropriate user. In some embodiments, reporting is provided automatically (e.g., daily, weekly, monthly, etc.).

Figure 9:
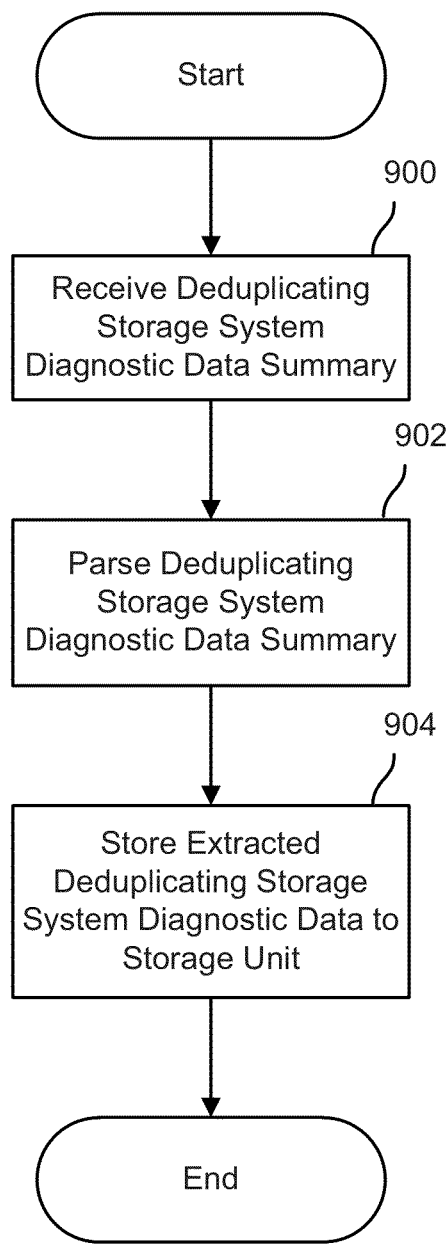
FIG. 9 is a flow diagram illustrating an embodiment of a process for receiving and storing deduplicating storage system diagnostic data.

FIG. 9 is a flow diagram illustrating an embodiment of a process for receiving and storing deduplicating storage system diagnostic data. In some embodiments, the process of FIG. 9 is used to implement process step 800 of FIG. 8. In the example shown, in 900, a deduplicating storage system diagnostic data summary is received. In 902, the deduplicating storage system diagnostic data summary is parsed. For example, the summary is parsed and important/desired data is extracted. In 904, the extracted deduplicating storage system diagnostic data is stored to a storage unit.

Figure 10:
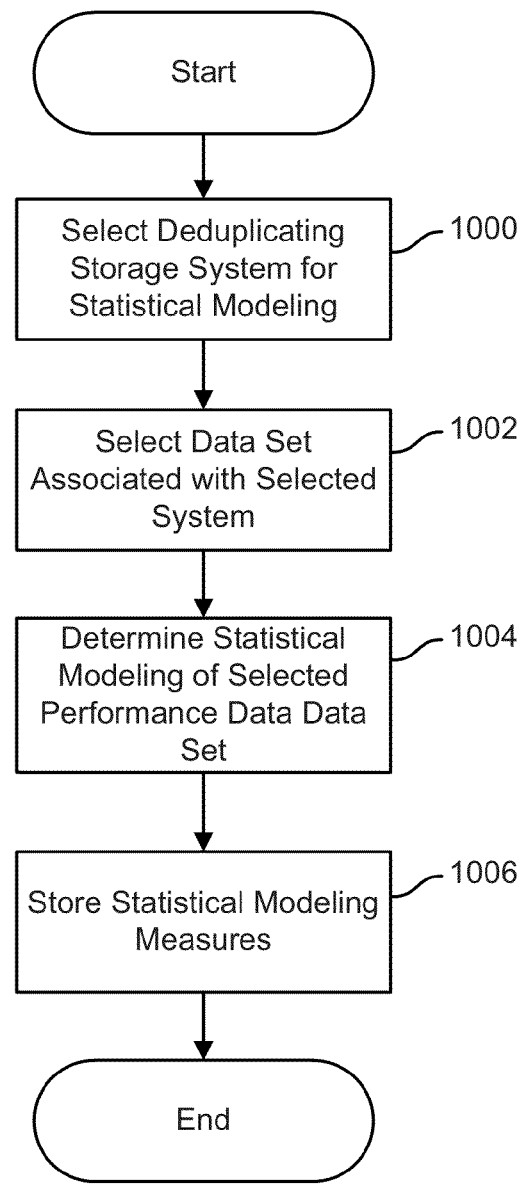
FIG. 10 is a flow diagram illustrating an embodiment of a process for statistical modeling.

FIG. 10 is a flow diagram illustrating an embodiment of a process for statistical modeling. In some embodiments, the process of FIG. 10 is used to implement process step 802 of FIG. 8. In the example shown, in 1000, a deduplicating storage system for statistical modeling is selected. In 1002, a data set associated with the selected deduplicating storage system is selected. In 1004, statistical modeling of the selected data set is determined. In 1006, determined statistical modeling measures are stored in a storage unit. In some embodiments, a deduplicating storage system is selected automatically by a deduplicating storage management system. In some embodiments, a selected data set is a subset of all data associated with a deduplicating storage system. In some embodiments, statistical modeling is determined by a deduplicating storage management system automatically (e.g., daily, weekly, monthly, etc.).

Figure 11:
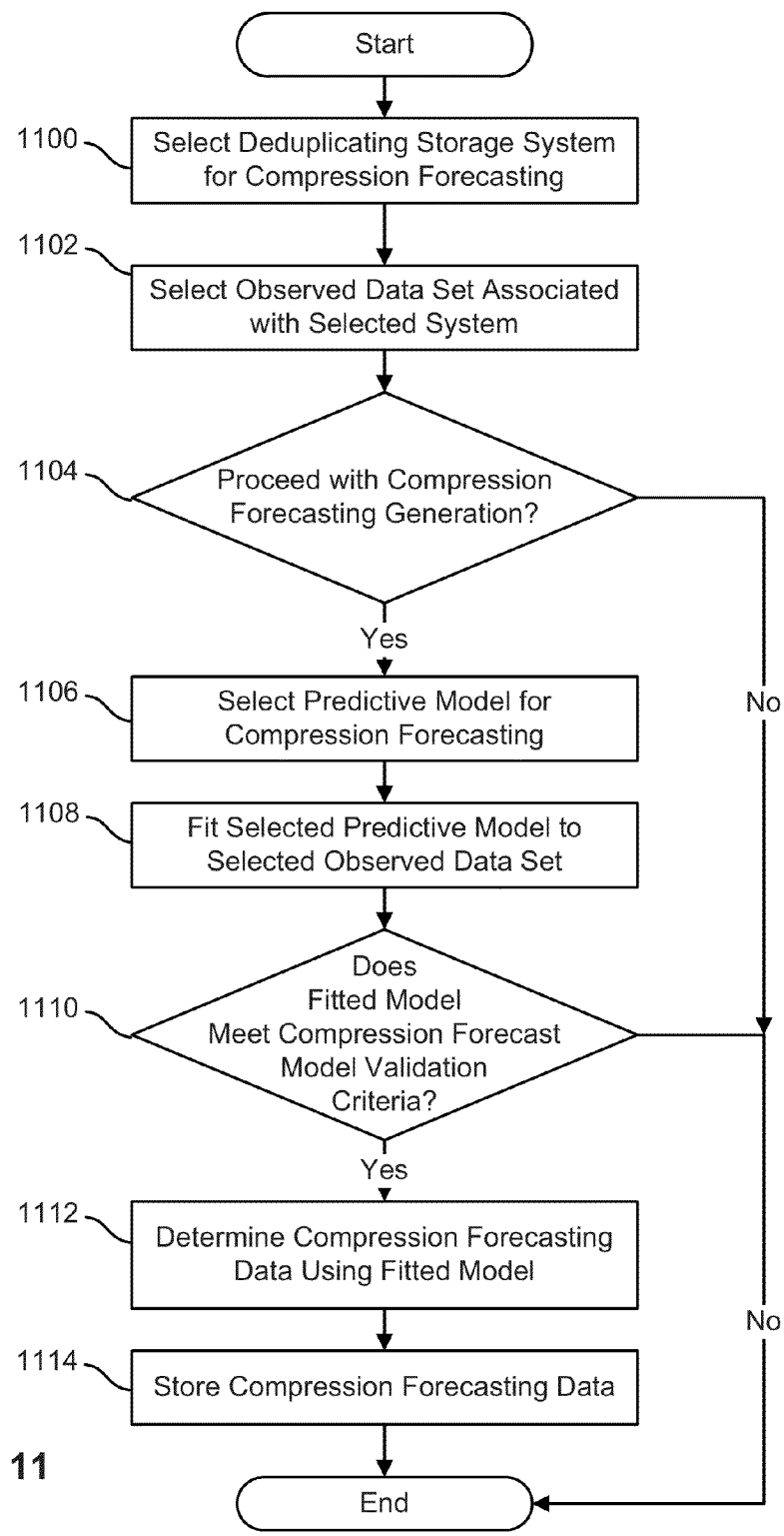
FIG. 11 is a flow diagram illustrating an embodiment of a process for compression forecasting.

FIG. 11 is a flow diagram illustrating an embodiment of a process for compression forecasting. In some embodiments, the process of FIG. 11 is used to implement process step 804 of FIG. 8. In the example shown, in 1100, a deduplicating storage system for compression forecasting is selected. In 1102, a data set comprising observed data associated with the selected deduplicating storage system is selected. In 1104, it is determined whether compression forecasting is to be generated. For example, compression forecasting is generated based at least in part on compression forecast generation criteria. In the event that compression forecasting is to be generated, the process continues to 1106. In the event that compression forecasting is not to be generated, the process ends. In 1106, a predictive model for compression forecasting is selected. In 1108, the selected predictive model is fitted to the selected observed data set. In 1110, it is determined whether the fitted model meets compression forecast model validation criteria. In the event that the fitted model meets compression forecast model validation criteria, in 1112, compression forecasting data is determined based at least in part on the fitted model. In 1114, the compression forecasting data is stored to a storage unit. In the event that the fitted model does not meet compression forecast model validation criteria, the process ends. In some embodiments, a selected data set is a subset of all data associated with a deduplicating storage system. In some embodiments, a predictive model comprises a linear model, logistic model, or any other appropriate predictive model. In some embodiments, compression forecasting is determined by a deduplicating storage management system automatically (e.g., daily, weekly, monthly, etc.).

Figure 12:
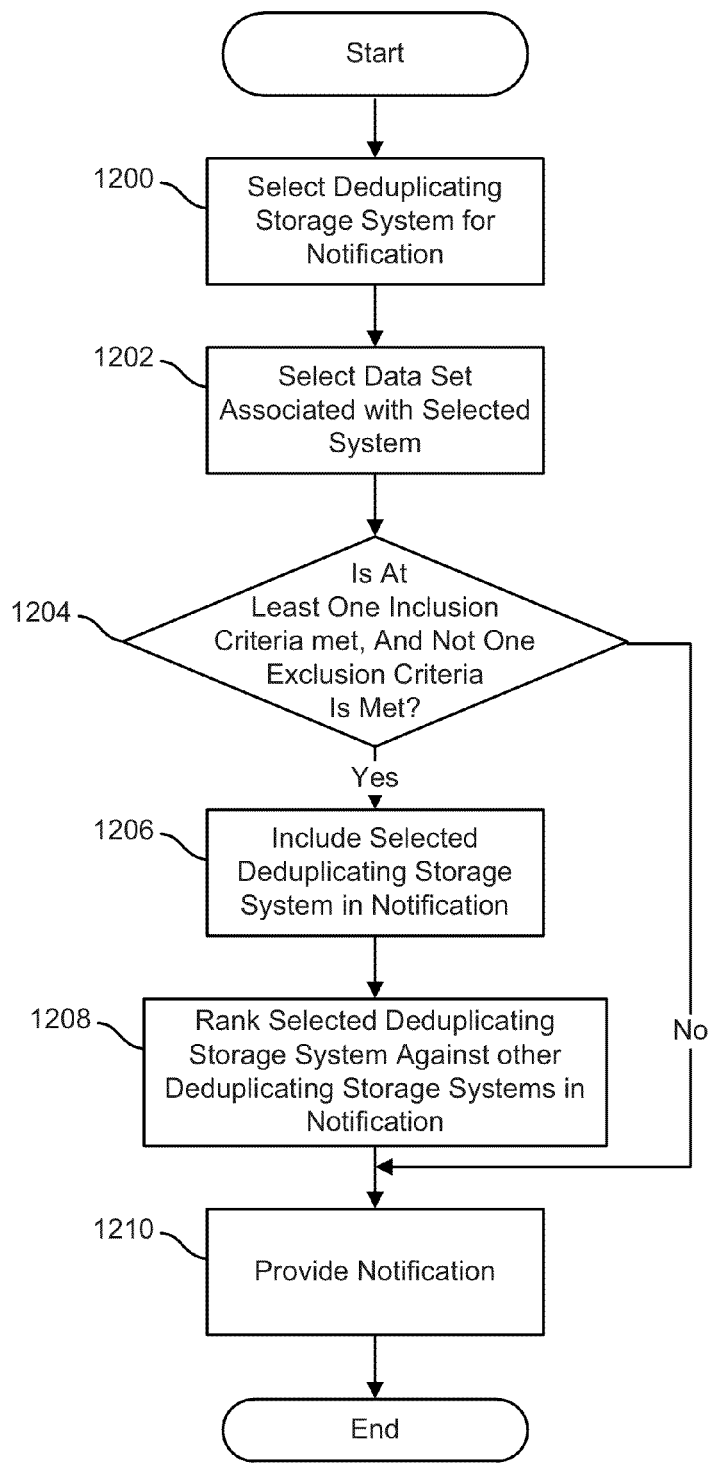
FIG. 12 is a flow diagram illustrating an embodiment of a process for providing notification.

FIG. 12 is a flow diagram illustrating an embodiment of a process for generating and providing notification. In some embodiments, the process of FIG. 12 is used to implement process step 806 of FIG. 8. In the example shown, in 1200, a deduplicating storage system for notification is selected. In 1202, a data set associated with the selected system is selected. In 1204, it is determine whether at least one of notification inclusion criteria and not one of exclusion criteria are met. In the event that at least one of notification inclusion criteria and not one of exclusion criteria are met, in 1206, the selected deduplicating storage system is included in a notification. In 1208, the selected deduplicating storage system is ranked against other deduplicating storage systems in the notification. In 1210, the notification is provided. In the event that not one of the inclusion criteria is met the process ends. In some embodiments, a selected data set is a subset of all data associated with a deduplicating storage system.

Figure 13:
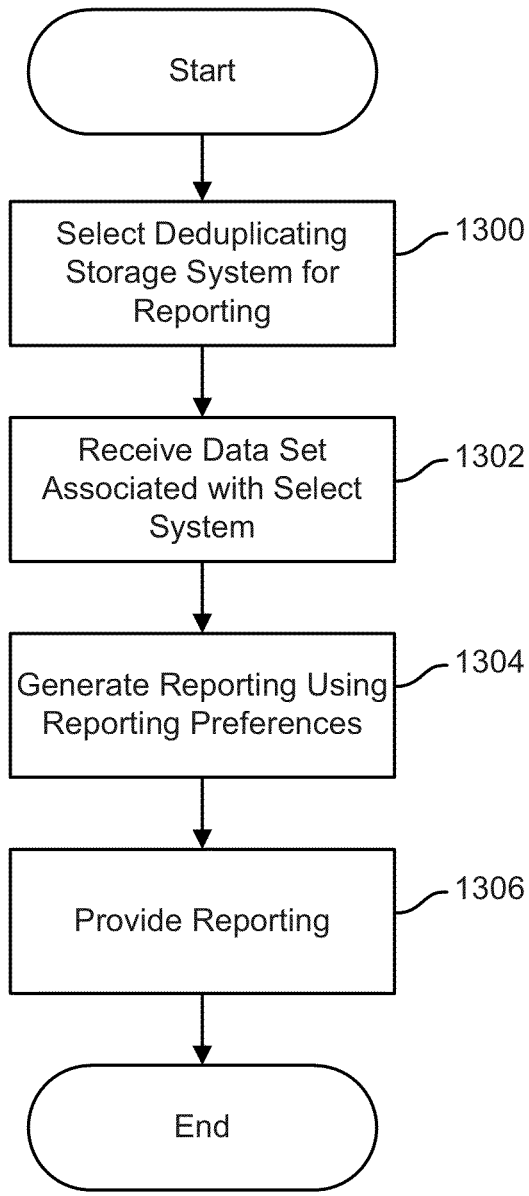
FIG. 13 is a flow diagram illustrating an embodiment of a process for providing reporting.

FIG. 13 is a flow diagram illustrating an embodiment of a process for providing reporting. In some embodiments, the process of FIG. 13 is used to implement process step 810 of FIG. 8. In the example shown, in 1300, a deduplicating storage system for reporting is selected. In 1302, a data set associated with the selected system is received. In 1304, reporting is generated based at least in part on reporting references. In 1306, reporting is provided.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for managing a storage system, comprising:
a processor configured to:
   receive storage system information from a deduplicating storage system;
   determine a compression forecast based at least in part on the storage system information, wherein the compression forecast comprises a compression threshold date, wherein the compression threshold date comprises a forecasted date on which a threshold compression factor of a deduplicating storage system will be reached; and
   provide the compression forecast;
   provide a notification, wherein the notification comprises a list of deduplicating storage systems that meet an inclusion criteria; wherein the list of included deduplicating storage systems is ranked by earliest compression threshold date; and a memory coupled to the processor and configured to provide the processor with instructions.

2. A system as in claim 1, wherein storage system information comprises one or more of the following: total capacity, total storage capacity used, index size, metadata size, cumulative compressed size, pre-compression size, and date information.

3. A system as in claim 1, wherein receiving storage system information comprises receiving a summary of storage system information.

4. A system as in claim 1, wherein the processor is further configured to receive inclusion criteria for including a deduplicating storage system in a notification, wherein the inclusion criteria comprises a plurality of threshold values.

5. A system as in claim 1, wherein the processor is further configured to determine a statistical measure, and wherein the statistical measure comprises one or more of: a standard deviation and an average.

6. A system as in claim 1, wherein determining a compression forecast comprises performing a regression analysis based at least in part on the storage system information, wherein the regression analysis is determined for a set of past storage system information data.

7. A system as in claim 6, wherein the regression analysis comprises one or more of: a linear regression analysis, a logistic regression analysis, and an ensemble regression analysis.

8. A system as in claim 6, wherein providing a compression forecast is based at least in part on compression forecast model validation criteria.

9. A system as in claim 8, wherein compression forecast model validation criteria comprise one or more of: a threshold R squared value, a threshold number of standard deviations of data points from an expected value of a set of data points, and a threshold slope.

10. A system as in claim 4, wherein one of the plurality of threshold values of the inclusion criteria comprises a specific number of days between a current date and a compression threshold date.

11. A system as in claim 1, wherein the processor is further configured for receiving exclusion criteria for excluding a deduplicating system from a notification, wherein the exclusion criteria comprise one or more of the following:
a number of days in which compression factor has not changed, a number of days in which storage system information has not been received, and a number of standard deviations.

12. A system as in claim 1, wherein a processor is further configured to provide reporting.

13. A system as in claim 12, wherein reporting comprises one or more of a report and graph.

14. A system as in claim 12, wherein reporting is based at least in part on a set of deduplicating storage systems, wherein the storage system information is received from the set of deduplicating storage systems and is aggregated across the set of deduplicating storage systems.

15. A system as in claim 1, wherein the notification is provided to one or more of the following: a client user, server user, or web user.

16. A system as in claim 1, wherein the threshold compression factor is unity.

17. A method for managing a storage system, comprising:
receiving storage system information from a deduplicating storage system;
determining, using a processor, a compression forecast based at least in part on the storage system information, wherein the compression forecast comprises a compression threshold date, wherein the compression threshold date comprises a forecasted date on which a threshold compression factor of a deduplicating storage system will be reached;
providing the compression forecast; and
providing a notification, wherein the notification comprises a list of deduplicating storage systems that meet an inclusion criteria; wherein the list of included deduplicating storage systems is ranked by earliest compression threshold date.

18. A computer program product for managing a storage system, the computer program product being embodied in a non-transitory computer readable storage medium and comprising computer instructions for:
receiving storage system information from a deduplicating storage system;
determining a compression forecast based at least in part on the storage system information, wherein the compression forecast comprises a compression threshold date, wherein the compression threshold date comprises a forecasted date on which a threshold compression factor of a deduplicating storage system will be reached;
providing the compression forecast;
providing a notification, wherein the notification comprises a list of deduplicating storage systems that meet an inclusion criteria; wherein the list of included deduplicating storage systems is ranked by earliest compression threshold date.

* * * * *